(12) United States Patent
Freitag et al.

(10) Patent No.: US 10,839,833 B1
(45) Date of Patent: Nov. 17, 2020

(54) SPIN TRANSFER TORQUE DEVICE WITH OXIDE LAYER BENEATH THE SEED LAYER

(71) Applicant: Western Digital Technologies, Inc., San Jose, CA (US)

(72) Inventors: James Mac Freitag, Sunnyvale, CA (US); Masahiko Hashimoto, San Jose, CA (US); Zheng Gao, San Jose, CA (US); Susumu Okamura, Fujisawa (JP)

(73) Assignee: WESTERN DIGITAL TECHNOLOGIES, INC, San Jose, CA (US)

( * ) Notice: Subject to any disclaimer, the term of this patent is extended or adjusted under 35 U.S.C. 154(b) by 0 days.

(21) Appl. No.: 16/803,960

(22) Filed: Feb. 27, 2020

Related U.S. Application Data

(60) Provisional application No. 62/830,958, filed on Apr. 8, 2019.

(51) Int. Cl.
 *G11B 5/31* (2006.01)
 *G11B 5/39* (2006.01)
 (Continued)

(52) U.S. Cl.
 CPC .......... *G11B 5/3903* (2013.01); *G11B 5/314* (2013.01); *H01F 10/329* (2013.01);
 (Continued)

(58) Field of Classification Search
 None
 See application file for complete search history.

(56) References Cited

U.S. PATENT DOCUMENTS

| 8,300,356 B2 | 10/2012 | Zhang et al. |
| 8,467,149 B2 | 6/2013 | Takeo et al. |

(Continued)

FOREIGN PATENT DOCUMENTS

| CN | 104835510 B | 11/2017 |
| JP | 2013251042 A | 12/2013 |

(Continued)

OTHER PUBLICATIONS

J G. Zhu et al., "Microwave Assisted Magnetic Recording", IEEE Transactions on Magnetics, vol. 44, No. 1, Jan. 2008, pp. 125-131.

(Continued)

*Primary Examiner* — William J Klimowicz
(74) *Attorney, Agent, or Firm* — Patterson + Sheridan, LLP; Steven H. Versteeg

(57) ABSTRACT

A spin transfer torque (STT) device is formed on an electrically conductive substrate and includes a ferromagnetic polarizer layer near the substrate, a ferromagnetic free layer, and a nonmagnetic spacer layer between the ferromagnetic polarizer layer and the ferromagnetic free layer. A multilayer structure is located between the substrate and the ferromagnetic polarizer layer. The multilayer structure includes a metal or metal alloy seed layer for the ferromagnetic polarizer layer and an intermediate oxide layer below and in contact with the seed layer. The intermediate oxide layer reflects spin current from the write pole and thus reduces undesirable spin pumping of the ferromagnetic polarizer layer.

20 Claims, 8 Drawing Sheets

(51) Int. Cl.
*H01F 10/32* (2006.01)
*G11B 5/00* (2006.01)
*H01L 27/22* (2006.01)

(52) U.S. Cl.
CPC .. *H01F 10/3286* (2013.01); *G11B 2005/0024* (2013.01); *H01F 10/3268* (2013.01); *H01L 27/228* (2013.01)

(56) References Cited

U.S. PATENT DOCUMENTS

| | | | |
|---|---|---|---|
| 8,488,373 | B2 | 7/2013 | Zhang et al. |
| 8,582,240 | B1 | 11/2013 | Chen et al. |
| 8,824,104 | B1 | 9/2014 | Koui et al. |
| 8,879,205 | B2 | 11/2014 | Shiimoto et al. |
| 8,970,996 | B2 | 3/2015 | Nagasaka et al. |
| 9,218,828 | B1 | 12/2015 | Koui et al. |
| 9,230,571 | B1 | 1/2016 | Chen et al. |
| 9,275,672 | B2 | 3/2016 | Shiroishi et al. |
| 9,355,655 | B1 | 5/2016 | Udo et al. |
| 9,368,135 | B2 | 6/2016 | Gao |
| 9,728,210 | B2 | 8/2017 | Okamura et al. |
| 9,805,746 | B1 | 10/2017 | Okamura et al. |
| 9,881,637 | B1 | 1/2018 | Wilson et al. |
| 10,121,497 | B1 | 11/2018 | Takahashi et al. |
| 10,186,284 | B2 | 1/2019 | Narita et al. |
| 10,236,021 | B2 | 3/2019 | Narita et al. |
| 10,276,193 | B2 | 4/2019 | Narita et al. |
| 10,325,618 | B1 | 6/2019 | Wu et al. |
| 10,446,175 | B2* | 10/2019 | Freitag ............... G11B 5/314 |
| 10,643,643 | B1* | 5/2020 | Gao .................. G11B 5/235 |
| 10,734,013 | B2* | 8/2020 | Gao .................. G11B 5/115 |
| 2008/0304176 | A1 | 12/2008 | Takagishi et al. |
| 2009/0059423 | A1 | 3/2009 | Yamada et al. |
| 2009/0310244 | A1 | 12/2009 | Shimazawa et al. |
| 2010/0074092 | A1 | 3/2010 | Zhu et al. |
| 2011/0134561 | A1* | 6/2011 | Smith .............. G11B 5/3133 360/59 |
| 2013/0062308 | A1 | 3/2013 | Funayama et al. |
| 2013/0250456 | A1 | 9/2013 | Yamada et al. |
| 2014/0139952 | A1 | 5/2014 | Takeo et al. |
| 2014/0146420 | A1 | 5/2014 | Shimizu et al. |
| 2014/0177100 | A1 | 6/2014 | Sugiyama et al. |
| 2015/0098150 | A1 | 4/2015 | Chiu et al. |
| 2016/0027455 | A1 | 1/2016 | Kudo et al. |
| 2017/0236537 | A1 | 8/2017 | Murakami et al. |
| 2017/0301855 | A1 | 10/2017 | Zhang et al. |
| 2018/0268848 | A1 | 9/2018 | Narita et al. |
| 2019/0088274 | A1 | 3/2019 | Narita et al. |
| 2019/0088275 | A1 | 3/2019 | Narita et al. |
| 2019/0259412 | A1* | 8/2019 | Gao ................. G11B 5/115 |
| 2019/0279666 | A1* | 9/2019 | Freitag ............. G11B 5/3909 |
| 2020/0013429 | A1* | 1/2020 | Freitag ............. G11B 5/314 |

FOREIGN PATENT DOCUMENTS

| | | |
|---|---|---|
| JP | 2018156709 A | 10/2018 |
| JP | 201957338 A | 4/2019 |
| WO | 2015126326 A1 | 8/2015 |

OTHER PUBLICATIONS

Kittel C., "On the Theory of Ferromagnetic Resonance Absorption", Phys. Rev. 73, pp. 155-161 (1948).

Braganca, et al., "Nanoscale magnetic field detection using a spin torque oscillator," Nanotechnology, vol. 21, No. 23, p. 235202, 2010.

Mallory, Mike et al; "Head and Media Challenges for 3 Tb/in2 Microwave-Assisted Magnetic Recording"; IEEE Transactions on Magnetics, vol. 50, No. 7, Jul. 2014 (8 pages).

* cited by examiner

SPIN TRANSFER TORQUE DEVICE WITH OXIDE LAYER BENEATH THE SEED LAYER

CROSS-REFERENCE TO RELATED APPLICATIONS

This application claims benefit of U.S. provisional patent application Ser. No. 62/830,958, filed Apr. 8, 2019, which is herein incorporated by reference.

BACKGROUND

Field

This disclosure relates generally to spin transfer torque (STT) devices, and more particularly to a perpendicular magnetic recording (PMR) system with a spin-torque oscillator (STO) type of STT device incorporated into the write head.

Description of the Related Art

Spin transfer torque (STT) is an effect in which the orientation of the magnetization of a magnetic layer in a magnetic tunnel junction (MTJ) or giant magnetoresistance (GMR) spin valve can be modified using a spin-polarized current. Electrons have a property known as spin, which is an intrinsic angular momentum. An electric current is generally unpolarized (i.e., consisting of 50% spin-up and 50% spin-down electrons), while a spin-polarized current is one with more electrons of either spin. Spin-polarized current can be produced by passing a current through a thick magnetic layer (usually called the "fixed" layer or "polarizer" layer). When spin-polarized current above a critical current density is directed into a second, thinner magnetic layer (the "free" layer), angular momentum can be transferred to the free layer, changing the orientation of the free layer's magnetization. This can be used to excite oscillations of the free layer's magnetization, as in a spin-torque oscillator (STO) type of STT device, or flip the orientation of the free layer's magnetization, as in STT memory cells in a non-volatile magnetic random access memory (MRAM) storage device.

The spin-torque oscillator (STO) type of STT device has been proposed for sensing magnetic fields, as described by P. M. Braganca, et al., "Nanoscale magnetic field detection using a spin torque oscillator," *Nanotechnology*, vol. 21, no. 23, p. 235202, 2010, and in U.S. Pat. No. 8,259,409 B2 assigned to the same assignee as this application. The STO has also been proposed for wireless communications applications, as described by T. Chen, "Spin Torque Oscillator-based Integrated Solutions for Magnetic Field Sensing and Wireless Communication Applications", *Electronics, Circuits and Systems (ICECS)*, 2014 21*st* IEEE International Conference on (pp. W005-), IEEE conference proceedings.

A STO type of STT device has also been proposed for perpendicular magnetic recording (PMR) systems, like a PMR disk drive, by incorporation of the STO into the disk drive's conventional write head. In one type of system using a STO, called microwave-assisted magnetic recording (MAMR), a high frequency oscillatory auxiliary magnetic field from a ferromagnetic free layer or field generation layer (FGL) in the STO is applied to the magnetic grains of the recording layer. The auxiliary field may have a frequency close to the resonance frequency of the magnetic grains in the recording layer to facilitate the switching of the magnetization of the grains at lower write fields from the conventional write head than would otherwise be possible without assisted recording. Conversely, MAMR may be used to increase the coercivity of the magnetic recording layer above that which could be written to by a conventional PMR alone. The increase in coercivity afforded by MAMR allows for a reduction in the size of the magnetic grains and thus a corresponding increase in recording density. MAMR systems are described by J. G. Zhu et al., "Microwave Assisted Magnetic Recording", *IEEE Transactions on Magnetics*, Vol. 44, No. 1, January 2008, pp. 125-131; and in U.S. Pat. No. 7,982,996 B2 and U.S. Pat. No. 8,970,996 B2, both assigned to the same assignee as this application.

In one proposed system, the STO is located between the write pole and the trailing magnetic shield of the write head. The STO electrical circuitry is connected to either separate electrodes, or to the write pole and trailing shield which function as the electrodes. The STO is a multilayer film stack made up of two or more ferromagnetic layers separated by a nonmagnetic electrically-conducting spacer layer. One of the ferromagnetic layers, the free layer, is located near the write pole and is designed to have its magnetization orientation oscillate in the presence of STO current perpendicular to the film planes. Another ferromagnetic layer, the polarizer or polarizer layer (PL), which may be the trailing shield, is designed to supply spin-polarized electrons to the free layer in the presence of the STO current. The STO electrical circuitry supplies DC current to the STO, with the electron flow being from the write pole to the trailing shield. The electrons are reflected from the trailing shield and become spin polarized by the polarizer, which results in spin-polarized current into the free layer. When spin-polarized current above a critical current density ($J_c$) is directed into the free layer, angular momentum is transferred to the free layer, creating a spin transfer torque on the magnetization of the free layer. This destabilizes the static equilibrium of the free layer's magnetization orientation, causing it to undergo sustained oscillation. If the oscillation frequency is near the resonance frequency of the magnetic grains in the recording layer, the switching of the magnetization of the grains will occur at a lower write field from the conventional write head. Even if the oscillation frequency of the free layer has little or no effect on the magnetic grains, the free layer magnetization will have a DC component that can assist writing by the conventional write head.

SUMMARY

In the above-described STT devices, the free layer is required to have a metal or metal alloy seed layer to promote the proper crystalline growth of the free layer. When the free layer's magnetization undergoes oscillation as a result of the spin transfer torque, the free layer generates spin current into the adjacent metal or metal alloy seed layer. This well-known effect, referred to as "spin pumping", causes the adjacent seed layer to dampen the oscillation of the free layer's magnetization. To overcome the damping effect, the DC critical current to initiate oscillation of the free layer must be increased. It is known to provide an oxide layer, like MgO, in direct contact with the free layer to minimize the spin pumping effect. However this is not possible when a seed layer is required to be in direct contact with the free layer to assure its proper crystalline structure.

Some embodiments relate to a magnetic recording write head and system with a spin-torque oscillator (STO) type of STT device located between the write pole of the write head and a trailing shield, and an intermediate oxide layer located between the write pole and the free layer. In one embodiment, the polarizer is the trailing shield of the write head. In another embodiment, the polarizer is a separate ferromagnetic polarizer layer separated from the trailing shield by a nonmagnetic capping layer. In still another embodiment, the polarizer layer is a separate ferromagnetic polarizer layer located between an intermediate oxide layer and the free layer. In certain embodiments, the polarizer may be the trailing shield of the write head, one or more separate polarizer layers, or combinations thereof. The STO electrical circuitry is located between the write pole and the trailing shield, with the electron flow being from the write pole to the trailing shield. The STO's ferromagnetic free layer is located near the write pole with the STO's nonmagnetic spacer layer between the free layer and the STO's ferromagnetic polarizer. The free layer is formed on a metal or metal alloy seed layer and the seed layer is on and in contact with an oxide layer that is between or intermediate the write pole and the seed layer.

Because the write pole is ferromagnetic, the electrons passing from the write pole to the free layer become spin polarized, which is undesirable because they counteract the spin transfer torque from the electrons reflected back from the polarizer. Thus in some embodiments a nonmagnetic electrically conducting buffer layer is located between the write pole and the intermediate oxide layer. The buffer layer removes the spin polarization of the electrons from the write pole without adversely affecting the performance of the STO.

In other embodiments the STT device is a magnetic tunnel junction (MTJ) memory cell in a non-volatile magnetic random access memory (MRAM) storage device. The MTJ cell's free layer is located between an electrically conductive substrate, which is typically a copper trace, and the MTJ cell's fixed layer that acts as the polarizer layer. In a manner similar to the STO embodiment, the free layer is formed on a metal or metal alloy seed layer and the seed layer is on and in contact with an oxide layer that is between or intermediate the electrically conductive substrate and the seed layer. The MRAM bit line is an electrically conductive layer above the fixed layer.

In the STO type of STT devices and the STT memory cell devices, the intermediate oxide layer reflects spin current from spin pumping by the free layer despite the presence of the metal or metal alloy seed layer being in direct contact with the free layer, thereby reducing the damping effect on the oscillation of the free layer's magnetization.

For a fuller understanding of the nature and advantages of the present disclosure, reference should be made to the following detailed description taken together with the accompanying figures.

DETAILED DESCRIPTION

Figure 1:
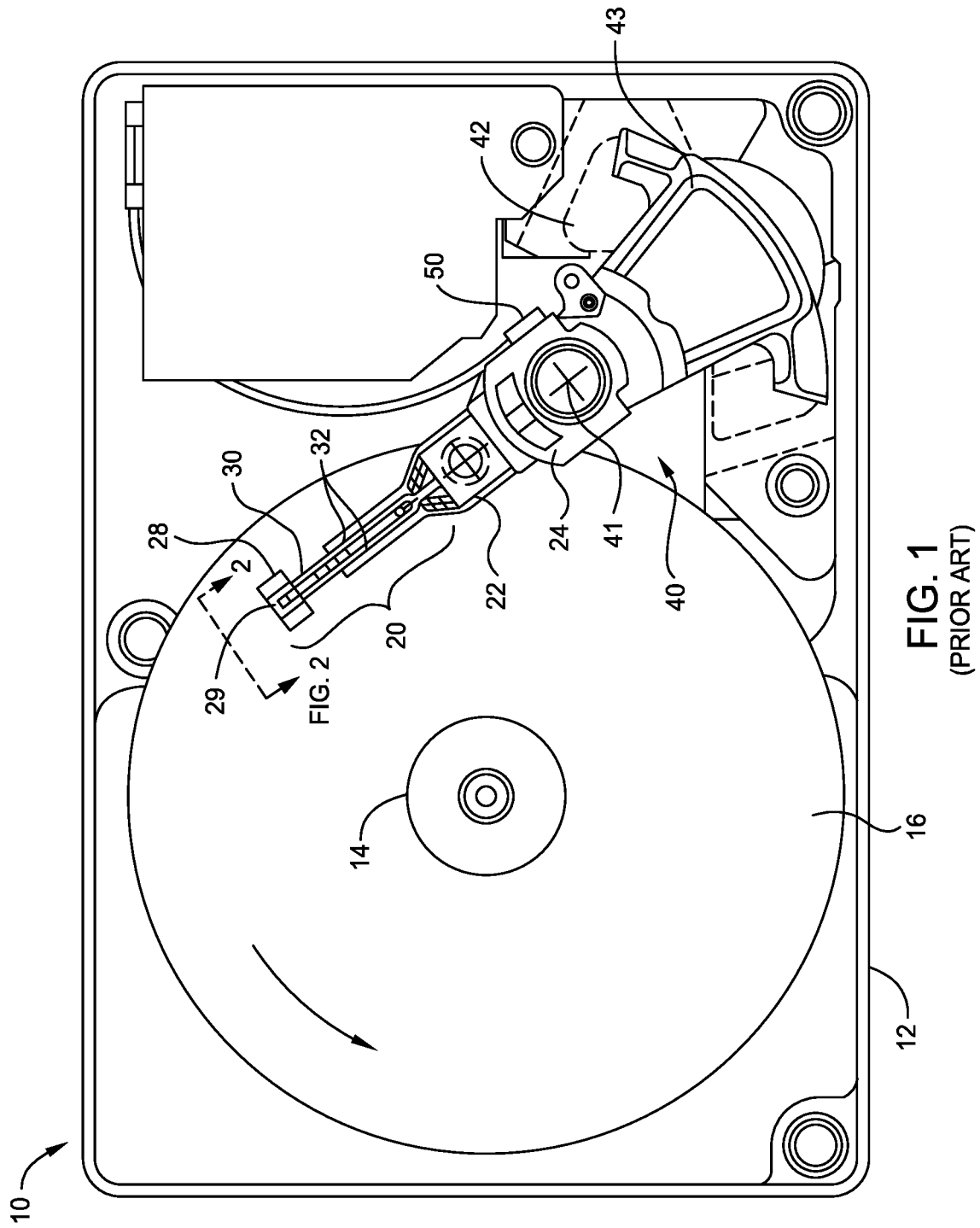
FIG. 1 is a top plan view of a conventional head/disk assembly of a hard disk drive with the cover removed.

FIG. 1 is a top plan view of a conventional head/disk assembly of a hard disk drive 10 with the cover removed. The disk drive 10 includes a rigid base 12 supporting a spindle 14 that supports a stack of disks, including top disk 16. The spindle 14 is rotated by a spindle motor (not shown) for rotating the disks in the direction shown by curved arrow on disk 16. The hard disk drive 10 has at least one load beam assembly 20 having an integrated lead suspension (ILS) or flexure 30 with an array 32 of electrically conductive interconnect traces or lines. The load beam assemblies 20 are attached to rigid arms 22 connected to an E-shaped support structure, sometimes called an E-block 24. Each flexure 30 is attached to an air-bearing slider 28. A magnetic recording read/write head 29 is located at the end or trailing surface 25 of slider 28. In some embodiments, the write head 29 will incorporate a spin-torque oscillator (STO) (not shown). The flexure 30 enables the slider 28 to "pitch" and "roll" on an air-bearing generated by the rotating disk 16. Disk drive 10 also includes a rotary actuator assembly 40 rotationally mounted to the rigid base 12 at a pivot point 41. The actuator assembly 40 is a voice coil motor (VCM) actuator that includes a magnet assembly 42 fixed to base 12 and a voice coil 43. When energized by control circuitry (not shown) the voice coil 43 moves and thereby rotates E-block 24 with attached arms 22 and load beam assemblies 20 to position the read/write heads 29 to the data tracks on the disks. The trace interconnect array 32 connects at one end to the read/write head 29 and at its other end to read/write circuitry contained in an electrical module or chip 50 secured to a side of the E-block 24. The chip 50 includes a read preamplifier and a write driver circuit.

Figure 2A:
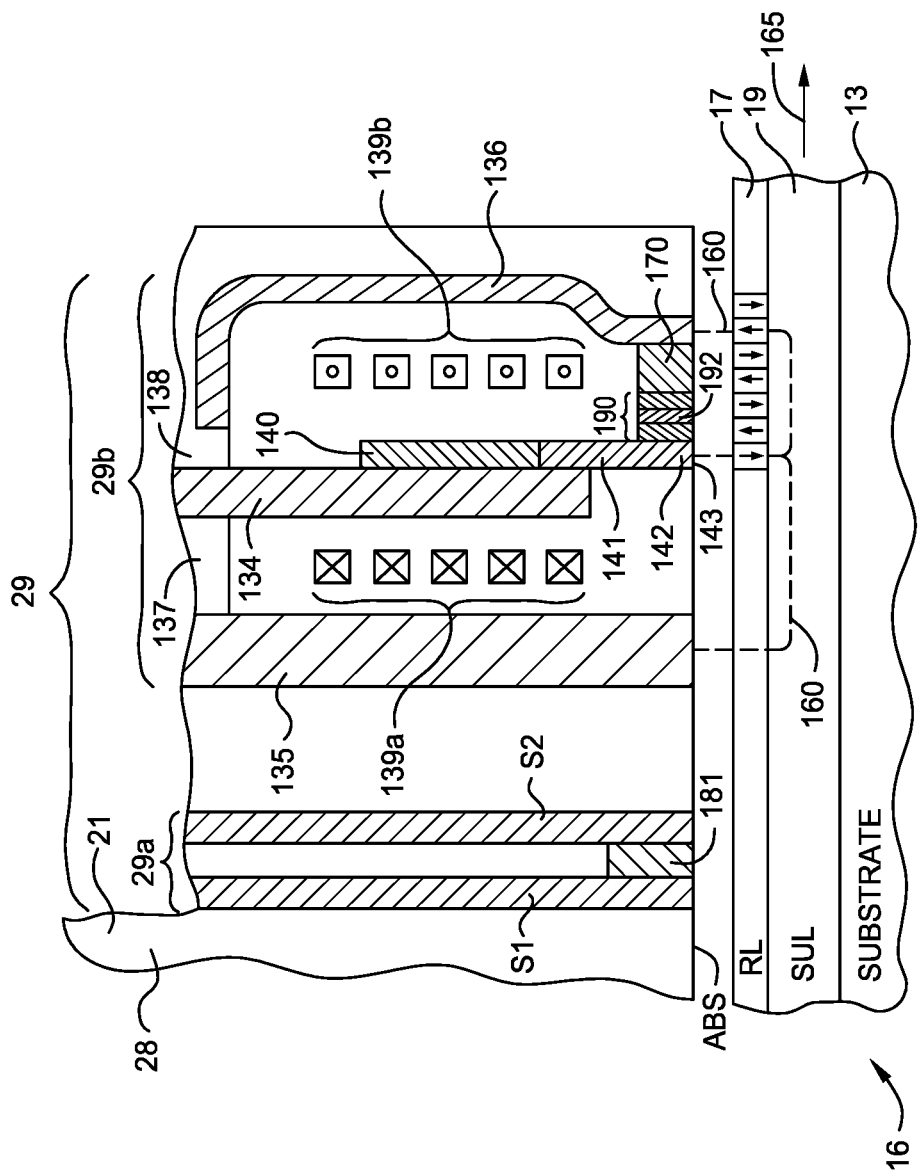
FIG. 2A is a side sectional view of a perpendicular magnetic recording (PMR) write head with an incorporated spin-torque oscillator (STO) as proposed in the prior art, a read head and a recording disk taken through a central plane that intersects a data track on the disk.

FIG. 2A is a side sectional view of a perpendicular magnetic recording write head with an incorporated STO as proposed in the prior art, a read head and a recording disk taken through a central plane that intersects a data track on the disk. As shown in FIG. 2A, a "dual-layer" disk 16 includes a perpendicular magnetic data recording layer (RL) 17 on a "soft" or relatively low-coercivity magnetically permeable underlayer (SUL) 19 formed on the disk substrate 13. The read/write head 29 is formed on slider 28 and includes read head 29a and write head 29b. Read head 29a includes a magnetoresistive (MR) read element or sensor 181 located between two magnetic shields S1, S2. The write head 29b is a single write pole type of perpendicular magnetic recording (PMR) write head and includes a yoke structure with main pole 134, write pole 140, first flux return pole 135, second flux return pole 136, trailing magnetic shield 170, STO 190 between write pole 140 and trailing shield 170, and yoke studs 137, 138 connecting the main pole and return poles 135, 136 respectively. The write head 29b also includes a thin film coil 139a, 139b shown in section around main pole 134. The write coil 139a, 139b is a helical coil wrapped around main pole 134, but the write coil may also be a conventional dual "pancake" coil in which all the coil sections are in substantially the same plane and wrapped around the yoke. A flared write pole (WP) 140 is part of the main pole 134 and has a flared portion 141 and a pole tip 142 with an end 143 that faces the outer surface of disk 16. Write current through coil 139a, 139b induces a magnetic field (shown by dashed line 160) from the WP 140 that passes through the RL 17 (to magnetize the region of the RL 17 beneath the WP 140), through the flux return path provided by the SUL 19, and back to the ends of return poles 135, 136, respectively.

The read/write head 29 is typically formed as a series of thin films deposited on a trailing surface 21 of air-bearing slider 28 that has its air-bearing surface (ABS) supported above the surface of disk 16. The MR read head 29a is comprised of MR sensor 181 located between MR shields S1 and S2 and is deposited on the trailing end of the slider 28 prior to the deposition of the layers making up the write head 29b. In FIG. 2A, the disk 16 moves past the write head 29b in the direction indicated by arrow 165, so the portion of slider 28 that supports the read head 29a and write head 29b is often called the slider "trailing" end, and the surface 21 perpendicular to the slider ABS on which the write head 29b is located is often called the slider "trailing" surface.

The RL 17 is illustrated with perpendicularly recorded or magnetized regions, with adjacent regions having opposite magnetization directions, as represented by the arrows. The magnetic transitions between adjacent oppositely-directed magnetized regions are detectable by the MR sensor 181 as the recorded bits.

FIG. 2A also illustrates a trailing shield (TS) 170 spaced from WP 140. The TS 170 is formed of ferromagnetic material. The STO 190 is located between WP 140 and TS 170. The STO 190 includes a ferromagnetic free layer 192 whose magnetization precesses in the presence of DC current from electrical circuitry (not shown) connected to the WP 140 and the TS 170.

Figure 2B:
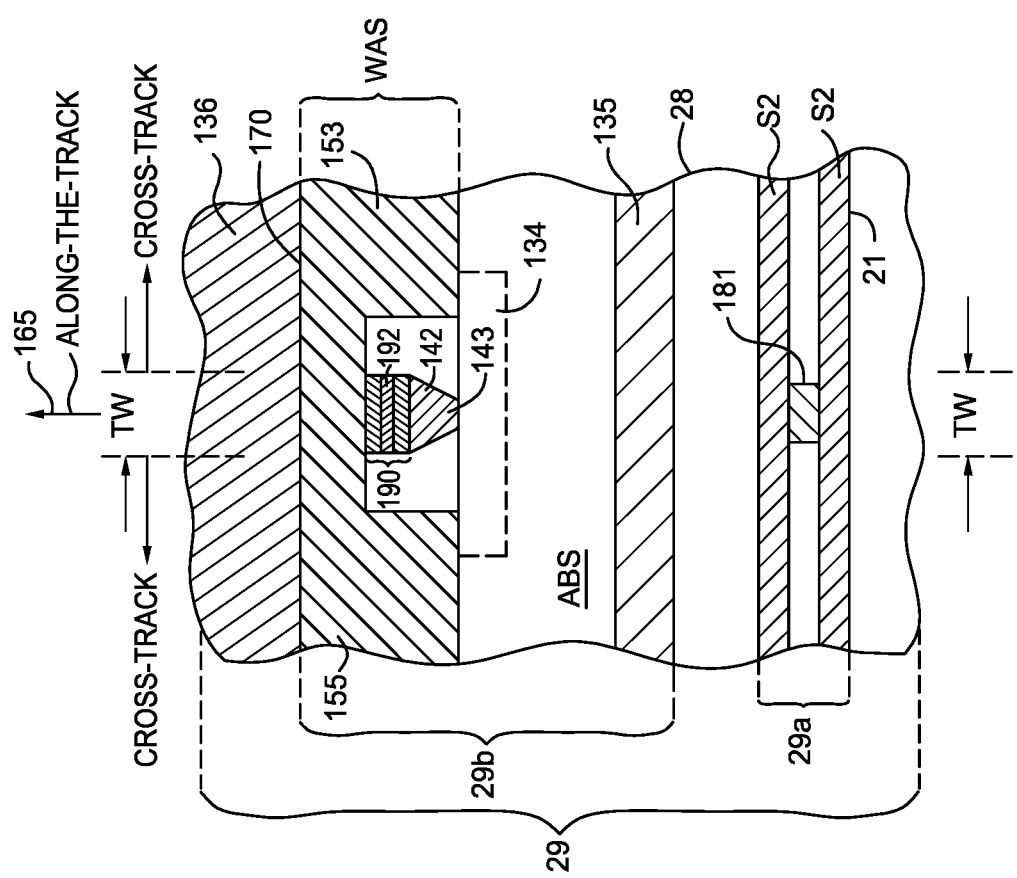
FIG. 2B is a view of the read/write head of FIG. 2A as seen from the disk.

FIG. 2B illustrates the read/write head 29 as seen from the disk 16. The ABS is the recording-layer-facing surface of the slider 28 that faces the disk 16 (FIG. 2A) and is shown without the thin protective overcoat typically present in an actual slider. The recording-layer-facing surface shall mean the surface of the slider 28 that is covered with a thin protective overcoat, the actual outer surface of the slider if there is no overcoat, or the outer surface of the overcoat. The phrase "substantially at the recording-layer-facing surface" shall mean actually at the surface or slightly recessed from the surface. The disk 16 (FIG. 2A) moves relative to the read/write head 29 in the direction 165, which is called the along-the-track direction. The direction perpendicular to direction 165 and parallel to the plane of the ABS is called the cross-track direction. The width of the end 143 of WP tip 142 in the cross-track direction substantially defines the track-width (TW) of the data tracks in the RL 17 (FIG. 2A). The main pole 134 is shown with dashed lines because it is recessed from the ABS (see FIG. 2A).

The portions identified as 153, 155 on opposite ends of TS 170 are side shields, which together with TS 170 form a wraparound shield (WAS) that generally surrounds the WP tip 142. The WAS that includes side shields 153, 155 and TS 170 is described in detail as a shield for a conventional perpendicular recording head in U.S. Pat. No. 7,002,775 B2, assigned to the same assignee as this application. The shields 170, 153, 155 all have ends substantially at the recording-layer-facing surface. The shields 170, 153, 155 are formed as a single-piece structure to form the WAS that substantially surrounds the WP tip 142 and are thus formed of the same material, typically a NiFe, CoFe or NiFeCo alloy, so that they have the same alloy composition. The side shields 153, 155 are separated from WP tip 142 by nonmagnetic gap material. The STO 190 with free layer 192 is located between the WP tip 142 and the TS 170. The WAS alters the angle of the write field and improves the write field gradient at the point of writing, and also shields the writing field at regions of the RL away from the track being written. The WAS is shown as connected to the return pole 136. However, the WAS may be a "floating" WAS shield not connected to either the return pole 136 or other portions of the yoke by flux-conducting material. Also, instead of a WAS, the write head 29b may have separate side shields not connected to the TS 170.

Figure 3:
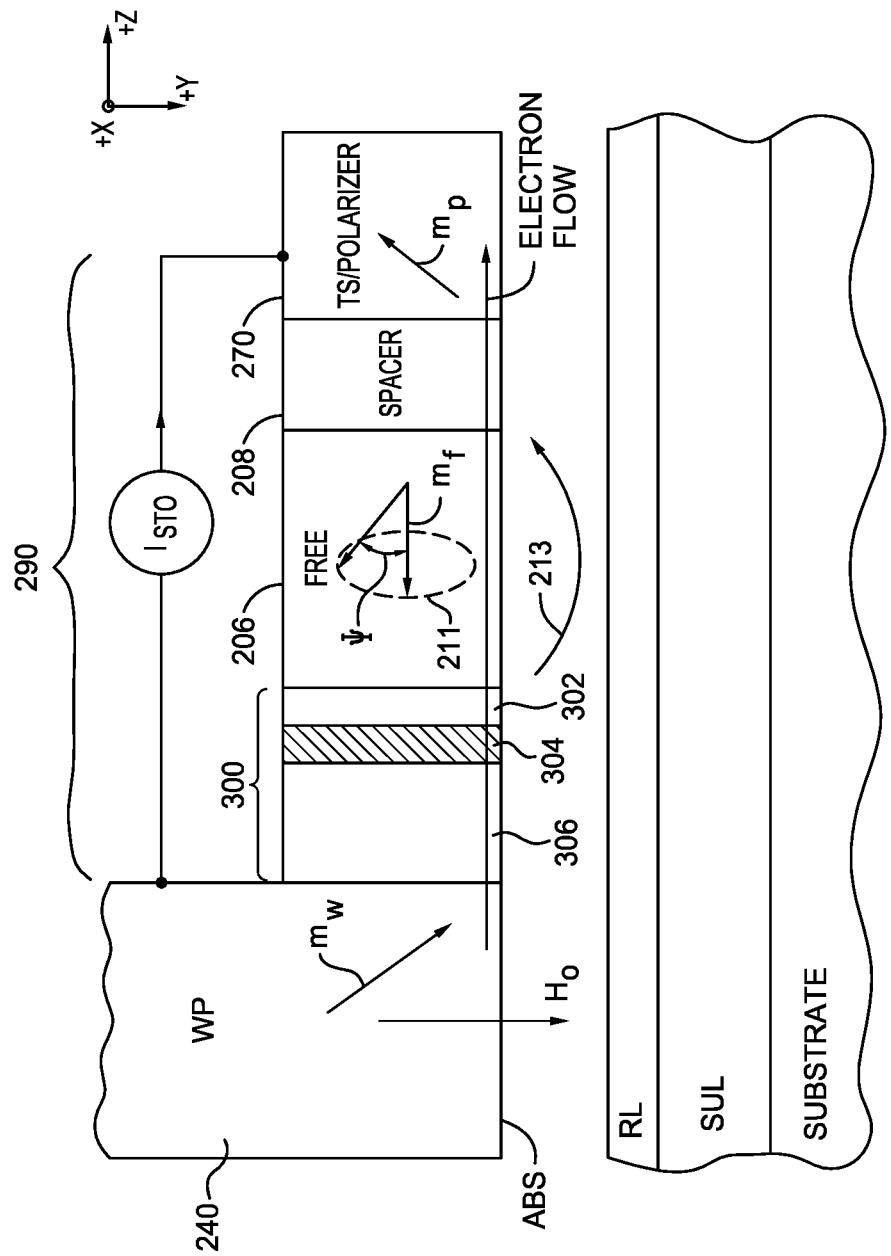
FIG. 3 is a side sectional view of a PMR write head with a STO incorporated into the write head according to one embodiment.

One embodiment is a spin-torque oscillator (STO) with a first electrode connected to the STO being formed of a magnetic material, a metal or metal alloy seed layer for the free layer located between the first electrode and the free layer, and an intermediate oxide layer between the electrode and the seed layer and in contact with the seed layer. The other electrode may be formed of a magnetic or nonmagnetic material. FIG. 3 is a side sectional view of a PMR write head with a spin-torque oscillator (STO) 290 incorporated into the write head according to one embodiment. The WP 240 functions as a first electrode and is formed of a ferromagnetic material. The TS 270 functions as the second electrode, and in this embodiment is also formed of a ferromagnetic material. The STO electrical circuitry is connected between both electrodes and during writing provides DC current $I_{STO}$ between the WP 240 and the TS 270. The WP 240 has a magnetization ($m_w$) and thus generates spin-polarized electrons when write current is applied to the write coil. The electron flow, by convention, is in the opposite direction from the WP 240 to the TS 270. The TS 270, which is formed of ferromagnetic material like CoFe, acts as the polarizer, i.e., the supplier of spin-polarized electrons, for the STO 290 and has a magnetization ($m_p$). The STO's ferromagnetic free layer 206 has an edge substantially at the ABS and has its magnetization ($m_f$) free to rotate. A nonmagnetic spacer layer 208 is located between the free layer 206 and the polarizer/TS 270. The nonmagnetic spacer layer 208 is typically formed of Cu, but may also be formed of other materials like Au or Ag. A multilayer structure 300 is located between the WP 240 and the free layer 206. The stack of layers making up the STO 290 are formed on the slider body after the write pole 240 is formed, using conventional deposition and lithographic techniques well-known in the fabrication of thin film read/write heads.

In one embodiment, the multilayer structure 300 includes metal or metal alloy seed layer 302, intermediate oxide layer 304 and buffer layer 306. The free layer 206 is grown on seed layer 302, which is formed on and in contact with intermediate oxide layer 304, which is formed on and in contact with buffer layer 306.

In operation of the STO 290, DC current ($I_{STO}$), with a current density J above a critical value $J_C$, is applied across the WP 240 and the TS 270. The flow of electrons is from the WP 240 through the multilayer structure 300 and free layer 206 to polarizer/TS 270, where the electrons are reflected and become spin-polarized. The reflected spin-polarized electrons apply a spin torque on the magnetization $m_f$ of the free layer 206. This induces a precessional motion of the magnetization $m_f$ of the free layer 206 in the opposite direction to the magnetization of the TS/polarizer layer $m_p$.

The polarizer magnetization $m_p$ is oriented slightly up and away from the RL in the presence of the write field $H_0$ from the WP 240. The free layer magnetization $m_f$ makes an angle $\psi$ with the X-Y plane and has a component in the X-Y plane that rotates at an azimuthal angle about the Z-axis with a certain frequency f. The rotation of the free layer magnetization about the Z-axis at this approximately fixed angle $\psi$ is depicted by the oval 211 which represents a circular precessional motion of the tip of the magnetization vector $m_f$ lying in a plane parallel to the X-Y plane. The frequency of precession depends on the properties and thicknesses of the materials making up the STO 290, but for a specific STO the frequency of precession is a function of the values of both $I_{STO}$ and $H_0$.

During writing, the WP 240 applies a write field $H_0$ to the magnetic grains in the recording layer (RL) at the same time the precession of the free layer magnetization $m_f$ from the STO 290 applies an auxiliary ac field at frequency f to the magnetic grains. The component of the field from free layer magnetization $m_f$ that is directed to the WP and aids the write field $H_0$ is given by $B_s t \cos \psi$, where BA is the magnetic field from the free layer. This results in microwave-assisted magnetic recording (MAMR), which improves the switching of the magnetization of the grains in the RL, with any additional improvement from the AC field depending on the frequency f at which the auxiliary field is applied. As is well known in the art, ferromagnetic materials absorb energy from AC magnetic fields more efficiently at or near their ferromagnetic resonance frequency, as described in Kittel C., "On the Theory of Ferromagnetic Resonance Absorption", *Phys. Rev.* 73, pp. 155-161 (1948). Accordingly, the frequency f of the auxiliary magnetic field from the free layer 206 of the STO 290 is designed to be preferably within a range near the ferromagnetic resonance of the magnetic material making up the grains in the RL, e.g., about 30-50 GHz. As a result, the write field required from the conventional PMR write head can be reduced from what would be required to switch the magnetization of the grains in the RL without MAMR. Conversely, MAMR may be used to increase the coercivity of the RL above that which could be written to by a conventional PMR write head alone. However, even if the frequency f of the auxiliary magnetic field from the free layer 206 is not near the resonance of the magnetic material in the grains of the RL, so that there is no microwave assistance, the magnetization $m_f$ will still provide a DC field component, as shown by arrow 213, that will assist the write field $H_0$. When write current from the coil is switched, the write field is switched from the direction into the RL (as depicted in Fig.) to out of the RL, which results in a switching of directions of the magnetizations $m_w$, $m_p$ and $m_f$, as well as the direction of DC field component 213.

The ferromagnetic free layer 206 may be formed of conventional ferromagnetic materials such as NiFe and CoFe alloys, but may also be formed of or comprise a ferromagnetic Heusler alloy, some of which are known to exhibit high spin-polarization in their bulk form. Full and half Heusler alloys are intermetallic with particular composition and crystal structure. Examples of Heusler alloys include but are not limited to the full Heusler alloys $Co_2MnX$ (where X is one or more of Al, Sb, Si, Sn, Ga, or Ge) and $Co_2FeZ$ (where Z is one or more of Ge, Si, Al, Sn or Ga). Examples also include but are not limited to the half Heusler alloys NiMnSb, and PtMnSb. A perfect Heusler alloy will have 100% spin-polarization. However it is possible that in a thin-film form and at finite temperatures, the band structure of the Heusler alloy may deviate from its ideal half metal structure and that the spin polarization will decrease. For example, some alloys may exhibit chemical site disorder and crystallize in the B2 structure instead of the L21 Heusler structure. Nevertheless, the spin polarization may exceed that of conventional ferromagnetic alloys. Thus, as used herein a "Heusler alloy" shall mean an alloy with a composition substantially the same as that of a known Heusler alloy, and which results in enhanced spin polarization compared to conventional ferromagnetic materials such as NiFe and CoFe alloys.

Figure 5:
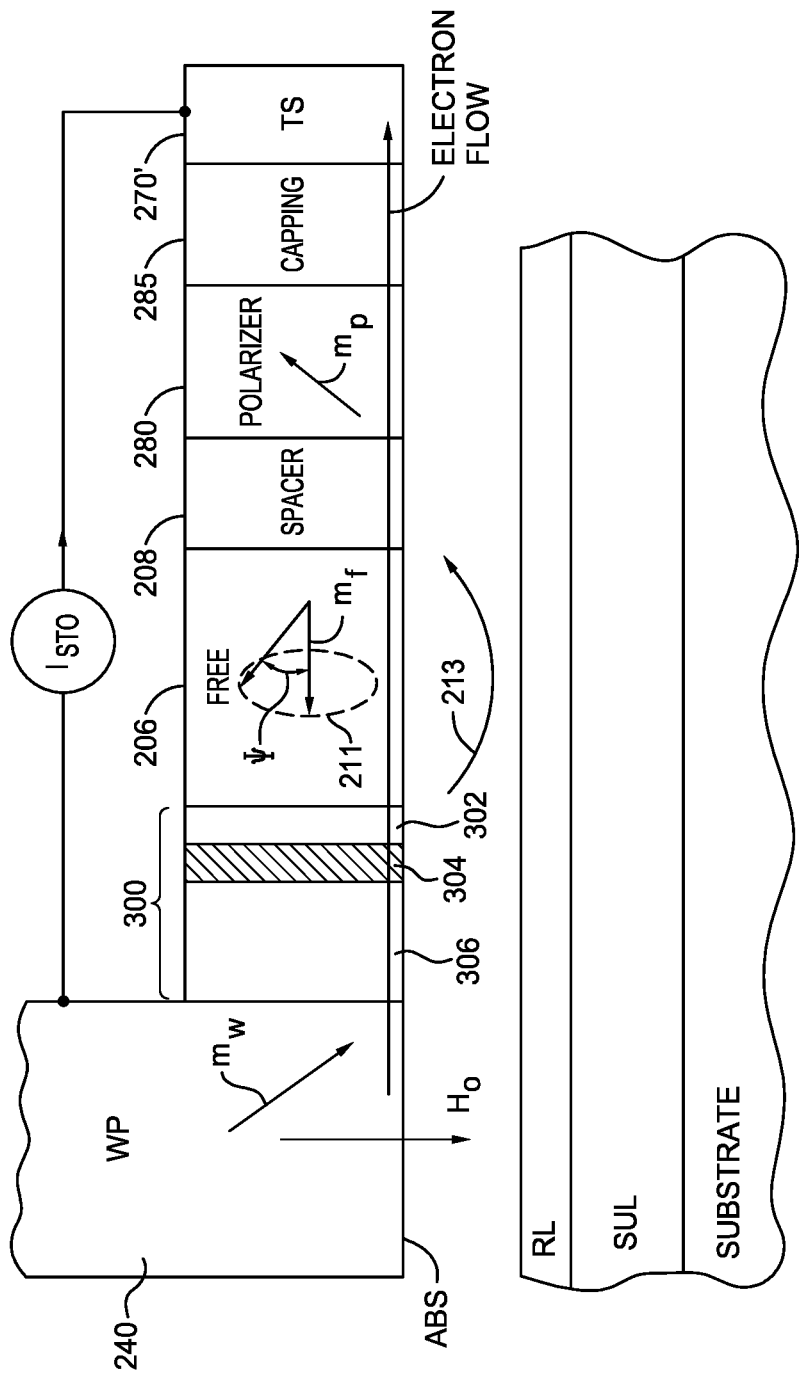
FIG. 5 is a side sectional view of a PMR write head with a STO incorporated into the write head according to another embodiment.

Seed layer 302 is required to assure proper crystalline growth of free layer 206. Proper crystalline growth of the free layer enables coherent oscillation of the free layer's magnetization. Typical seed layers include single or multiple metal or metal alloy films like Cu, Cr, Ta, Ru, Hf, Nb and NiAl. For NiFe and CoFe alloys, the seed layer may be Ru or a Ta/Ru bilayer. For a Heusler alloy free layer, the seed layer may be NiAl or a Ru/NiAl bilayer. Because the seed layer 302 is a metal or metal alloy, spin pumping of spin current into the seed layer from the adjacent free layer 206 causes undesirable damping of the oscillation of the free layer's magnetization. However, in some embodiments, the intermediate oxide layer 304, which is in contact with the seed layer 302, reflects spin current from the free layer 206 and thus reduces the damping effect. The intermediate oxide layer may be an oxide of one or more of Mg, Al, Ti, Ta, with the preferred oxide being MgO. In one embodiment, the free layer is the Heusler alloy $Co_2MnGe$, the seed layer is a single layer of NiAl and the intermediate oxide layer is MgO. MgO is known as a capping layer for free layers in structures where the free layer is above and in contact with the polarizing layer, as shown in FIG. 5 of U.S. Pat. No. 9,230,571 B1. However, it has been discovered that MgO cannot function as a seed layer for the free layer, especially if the free layer is a formed of a Heusler alloy, because the free layer will not grow with the desired crystalline structure. Because the intermediate oxide layer 304 is part of the current $I_{STO}$ current path, it should be as thin as possible so as to not increase the electrical resistance of the STO 290. The intermediate oxide layer 304 may have a thickness in the range of 0.1 to 0.5 nm. The seed layer 302 should also be kept as thin as possible without adversely affecting the growth of the free layer 206, so as to minimize the effect of spin currents. For Ru, NiAl and Ru/NiAl seed layers, the thickness may be in the range of 1 to 9 nm.

In some embodiments, a nonmagnetic electrically conducting buffer layer 306 is located between the write pole 240 and the intermediate oxide layer 304. Because the write pole 240 is ferromagnetic, the electrons passing from the write pole 240 toward the free layer 206 will become spin polarized, which is undesirable because they counteract the spin transfer torque from the electrons reflected back from the TS/polarizer 270. The buffer layer 306 removes the spin polarization of the electrons from the write pole 240. The buffer layer should preferably be thicker that its spin diffusion length, i.e., the length over which the polarization of the electron current is destroyed owing to spin flip scattering, so that it can destroy the polarization of electrons flowing from the magnetic WP 240. The buffer layer 306 may be formed of one or more metal or metal alloy films, for example one or more films selected from one or more of Cu, Cr, Ta, Ru, Hf and Nb and their alloys. Also, because the intermediate oxide layer 304 will reflect spin-polarized electrons it may also function to remove the spin polarization of electrons from the write pole 240.

Figure 4:
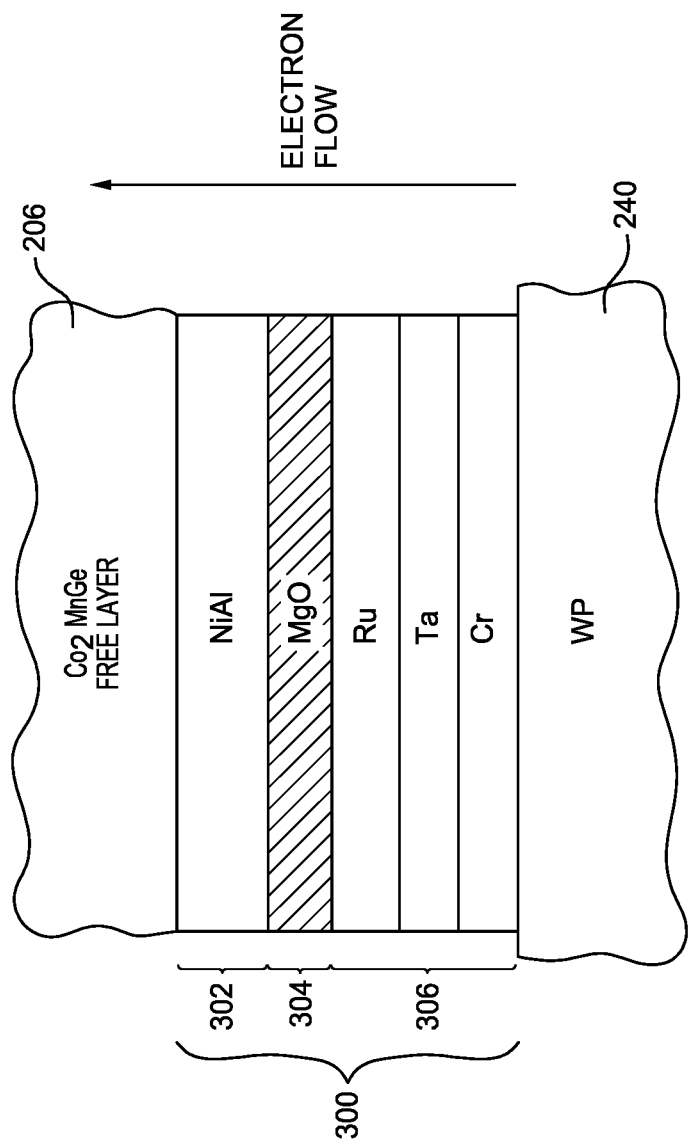
FIG. 4 is a sectional view showing the multilayer structure, including the intermediate oxide layer, between the write pole and the free layer's seed layer according to one embodiment.

FIG. 4 is a sectional view showing the multilayer structure 300 and free layer 206 according to one embodiment. The multilayer structure 300 is a multilayer comprising buffer layer 306 on WP 240, intermediate oxide layer 304 on buffer layer 306, and seed layer 302 on and in contact with intermediate oxide layer 302. The buffer layer 306 is one or more films selected from one or more of Cu, Cr, Ta, Ru, Hf and Nb and their alloys. The intermediate oxide layer is formed of one or more oxides of Mg, Al, Ti, Ta. The seed layer 302 is one or more films of Cu, Cr, Ta, Ru, Hf, Nb and NiAl. In the embodiment depicted in FIG. 4, the free layer 206 is a $Co_2MnGe$ Heusler alloy. The buffer layer 306 is a Cr/Ta/Ru trilayer, the intermediate oxide layer is MgO and the seed layer is NiAl. The total thickness of multilayer structure 300 is preferably greater than or equal to 3 nm and less than or equal to 15 nm.

FIG. 5 is a side sectional view of the write head with incorporated STO according to another embodiment. In this embodiment there is a separate polarizer layer 280 adjacent the spacer layer 208 and a nonmagnetic capping layer 285 between the polarizer layer 280 and the TS 270'. The polarizer layer 280 may be formed of a magnetic material like CoFe, NiFe, CoFeNi, CoMnGe, NiCo, NiFeCu, CoFeMnGe, CoMnSi, CoFeSi, other soft or hard ferromagnetic materials, other Heusler alloys, other suitable magnetic layers, or multiple layers thereof. The capping layer 285 may be formed of a layer or multilayer of metals or metal alloys, such as Ru, Ir, Ta, Ti metals and metal alloys.

Figure 6:
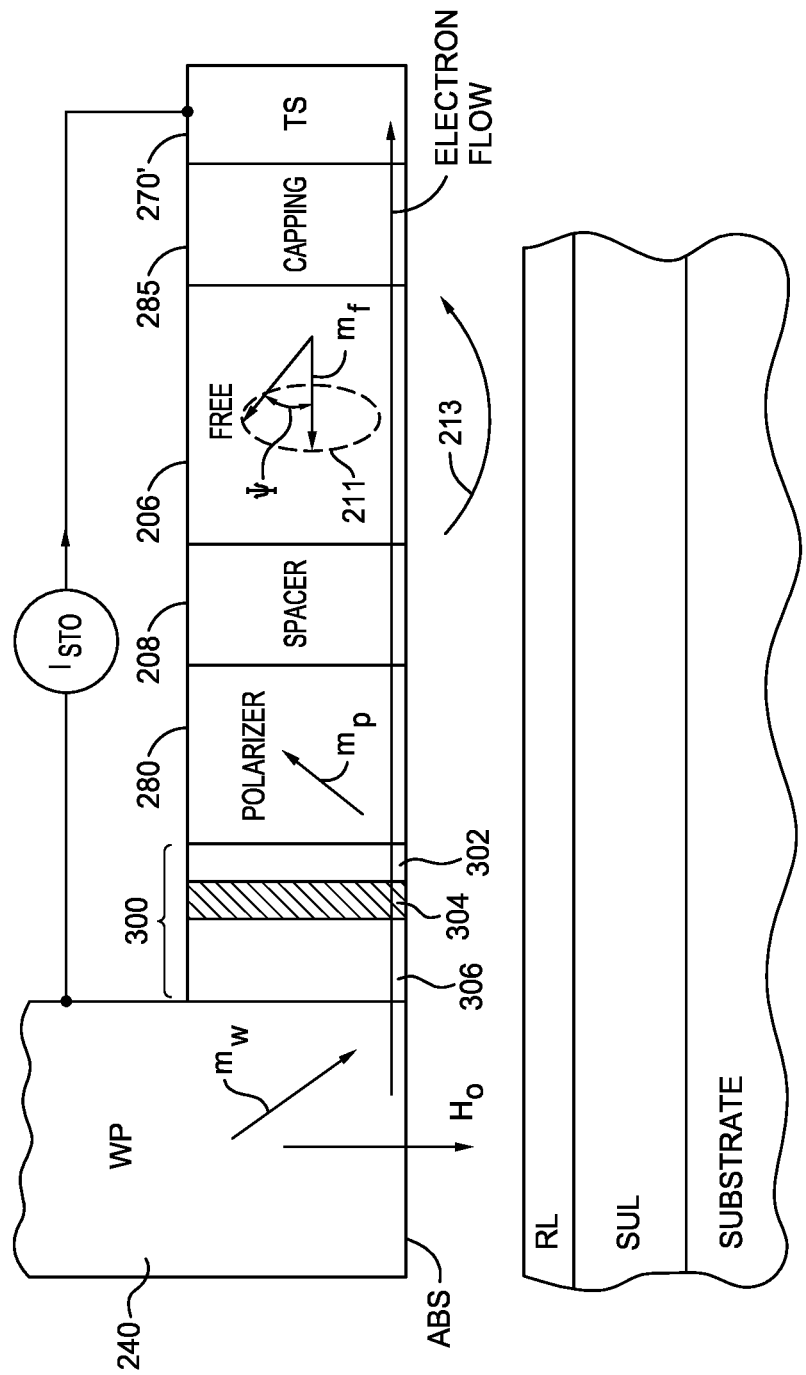
FIG. 6 is a side sectional view of a PMR write head with a STO incorporated into the write head according to still another embodiment.

FIG. 6 is a side sectional view of a PMR write head with a STO incorporated into the write head according to still another embodiment. In this embodiment, there is a separate polarizer layer 280 formed over the multilayer structure 300. The polarizer layer 280 may be formed of a magnetic material like CoFe, NiFe, CoFeNi, CoMnGe, NiCo, NiFeCu, CoFeMnGe, CoMnSi, CoFeSi, other soft or hard ferromagnetic materials, other Heusler alloys, other suitable magnetic layers, or multiple layers thereof. The spacer layer 208 is formed over the polarizer layer 280. The free layer 206 is formed over the spacer layer 208. A nonmagnetic capping layer 285 is between the free layer 206 and the TS 270'. The capping layer 285 may be formed of a layer or multilayer of metals or metal alloys, such as Ru, Ir, Ta, Ti, metals, and metal alloys.

The multilayer structure 300 comprises an intermediate oxide layer 304 and a seed layer 302 on and in contact with intermediate oxide layer 302. The intermediate oxide layer 302 is formed of one or more oxides of Mg, Al, Ti, Ta. MgO does not function as a seed layer for the polarizer layer 280 because the polarizer layer will not grow with the desired crystalline structure. Because the intermediate oxide layer 304 is part of the current $I_{STO}$ current path, it should be as thin as possible so as to not increase the electrical resistance of the STO 290. The intermediate oxide layer 304 may have a thickness in the range of 0.1 to 0.5 nm. Because the write pole 240 is ferromagnetic, the electrons passing from the write pole 240 toward the polarizer layer 280 will become spin polarized, which is undesirable because spin polarized electrons from the write pole may cause a spin pumping effect to the polarization layer 280 requiring an undesirable high critical current Jc for magnetization reversal of the polarization layer 280. The intermediate oxide layer 304 will reflect and remove spin-polarized electrons from the write pole 240.

Seed layer 302 provides proper crystalline growth of polarizer layer 208. Proper crystalline growth of the polarizer layer enables higher spin torque transform from the polarizer layer 208 to the free layer 206. The seed layer includes single or multiple metal or metal alloy films like Cu, Cr, Ta, Ru, Hf, Nb and NiAl. For NiFe and CoFe alloys, the seed layer may be Ru or a Ta/Ru bilayer. The seed layer 302 should be kept thin without adversely affecting the growth of the polarizer layer 280. The thickness of the seed layer 302 is in the range of 1 to 9 nm in certain embodiments.

In some embodiments, a nonmagnetic electrically conducting buffer layer 306 is located between the write pole 240 and the intermediate oxide layer 304. The buffer layer 306 may be formed of one or more metal or metal alloy films, for example one or more films selected from one or more of Cu, Cr, Ta, Ru, Hf and Nb and their alloys.

In certain embodiments, the polarizer is a combination of two or more polarizers selected from the group consisting of the TS/polarizer 270 of FIG. 3, the polarizer layer 280 of FIG. 5, and the polarizer layer 280 of FIG. 6.

A STO with a multilayer structure according to one embodiment with a structure of (Cr-1.5 nm/Ta-2.7 nm/Ru-2 nm/MgO-0.3 nm/NiAl-1.5 nm) was compared with a STO with a seed layer of the same total thickness (8 nm) but without an intermediate MgO layer and with a structure of (Cr-1.5 nm/Ta-2 nm/Ru-2 nm/NiAl-2.5 nm). The free layer for both STOs was formed of a $Co_2MnGe$ Heusler alloy with a thickness of 3.7 nm. The magnetic moment ($B_st$) of the Heusler alloy free layer was unchanged by the insertion of the intermediate MgO layer, indicating that the preferred texture of the NiAl seed layer was preserved. For the STO with the MgO in the multilayer structure, even though the intermediate MgO layer was not in direct contact with the free layer because of the NiAl seed layer, damping was reduced by approximately 15% (from a Gilbert damping parameter value of 0.0082 to 0.0070), while $J_c$ was decreased by about 15% (from 91.9 MA/cm$^2$ to 78.1 MA/cm$^2$). The component of the field from the free layer that aids the write field ($B_{st}$ cos ψ), which is a figure of merit for the improvement of write head performance, increased by about 10%.

Figure 7:
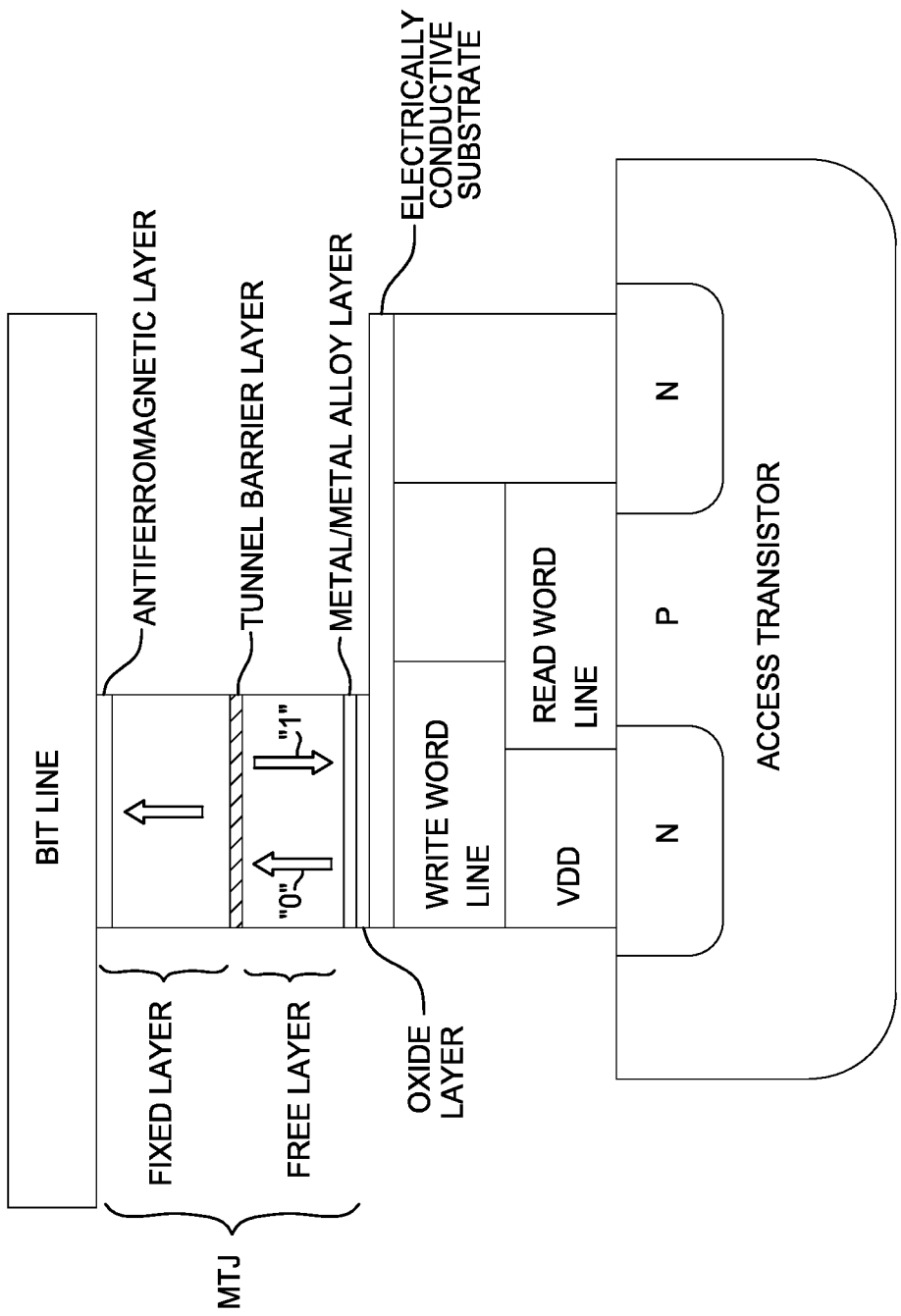
FIG. 7 is a view of a spin transfer torque magnetic random access memory (STT-MRAM) perpendicular-to-the-plane magnetic tunnel junction (MTJ) cell according to one embodiment.

A STT-MRAM perpendicular-to-the-plane magnetic tunnel junction (MTJ) cell according to one embodiment is depicted in FIG. 7. In a MRAM structure the STT device is a MTJ cell that includes a ferromagnetic pinned or fixed layer, which may be synthetic antiferromagnetic structure, a dielectric tunnel barrier layer (like a MgO tunnel barrier layer) and a ferromagnetic free layer. The fixed layer acts as the polarizer layer for the source of spin-polarized electrons. It may be pinned by an optional antiferromagnetic layer as shown in FIG. 7. The orientation of the magnetization of the free layer is capable of switching from a parallel configuration with respect to that of the fixed layer (low resistance state by "0") to an antiparallel configuration (high resistance state or "1") by applying STT current through the MTJ cell. Thus, two binary states can be realized for digital data storage in the MRAM. In one embodiment, the intermediate oxide layer is formed on the electrically conductive substrate, which is typically a copper trace. The substrate is electrically connected to an access transistor. The metal or metal alloy seed layer is formed on the intermediate oxide layer and the ferromagnetic free layer is formed on the seed layer. An optional adhesion layer such as a Ta layer (not shown) may be located between the substrate and the intermediate oxide layer. Like the STO embodiment, the intermediate oxide layer may be formed of an oxide of one or more of Mg, Al, Ti and Ta, and the seed layer may comprise one or more films selected from one or more of Cu, Cr, Ta, Ru, Hf, Nb and NiAl. The bit line is an electrically conductive layer above the fixed layer. While FIG. 7 depicts a perpendicular-to-the-plane MTJ cell, the STT-MRAM may also be one with MTJ cells wherein each of the fixed and free layers has its magnetization oriented in-plane.

While the present disclosure has been particularly shown and described with reference to the preferred embodiments, it will be understood by those skilled in the art that various changes in form and detail may be made without departing from the spirit and scope of the disclosure. Accordingly, the disclosure is to be considered merely as illustrative and limited in scope only as specified in the appended claims.

What is claimed is:

1. A spin transfer torque (STT) device, comprising:
an electrically conductive substrate;
a ferromagnetic polarizer layer;
an intermediate oxide layer between the substrate and the polarizer layer and comprising an oxide of one or more of Mg, Al, Ti and Ta;
a metal or metal alloy seed layer for the polarizer layer on and in contact with the intermediate oxide layer, wherein the polarizer layer is on and in contact with the seed layer;
a ferromagnetic free layer;
a nonmagnetic spacer layer between the polarizer layer and the free layer, wherein the polarizer layer is located between the substrate and the free layer; and
an electrically conductive layer on the free layer.

2. The STT device of claim 1, wherein the intermediate oxide layer consists of MgO.

3. The STT device of claim 1, wherein the intermediate oxide layer has a thickness greater than or equal to 0.1 nm and less than or equal to 0.5 nm.

4. The STT device of claim 1, wherein the seed layer comprises one or more films selected from one or more of Cu, Cr, Ta, Ru, Hf, Nb and NiAl.

5. The STT device of claim 1, wherein the seed layer comprises a film selected from a Ru film and a NiAl film.

6. The STT device of claim 1, wherein the seed layer has a thickness greater than or equal to 1 nm and less than or equal to 9 nm.

7. A spin torque oscillator (STO) comprising:
a first electrically conductive electrode;
a ferromagnetic polarizer layer;
an intermediate oxide layer between the first electrode and the polarizer layer and comprising an oxide of one or more of Mg, Al, Ti and Ta;
a metal or metal alloy seed layer for a ferromagnetic free layer on and in contact with the intermediate oxide layer, wherein the polarizer layer is on and in contact with the seed layer;
the ferromagnetic free layer;
a nonmagnetic spacer layer between the polarizer layer and the free layer, wherein the polarizer layer is located between the first electrode and the free layer; and
a second electrically conductive electrode.

8. The STO of claim 7, wherein the intermediate oxide layer consists of MgO.

9. The STO of claim 7, wherein the intermediate oxide layer has a thickness greater than or equal to 0.1 nm and less than or equal to 0.5 nm.

10. The STO of claim 7, wherein the seed layer comprises one or more films selected from one or more of Cu, Cr, Ta, Ru, Hf, Nb and NiAl.

11. The STO of claim 7, wherein the seed layer has a thickness greater than or equal to 1 nm and less than or equal to 9 nm.

12. The STO of claim 7, further comprising a buffer layer between the first electrode and the intermediate oxide layer, wherein the buffer layer is on and in contact with the first electrode and the intermediate oxide layer is on and in contact with the buffer layer.

13. The STO of claim 12, wherein the buffer layer comprises one or more films selected from one or more of Cu, Cr, Ta, Ru, Hf and Nb and their alloys.

14. The STO of claim 7, wherein the second electrically conductive electrode is formed of a ferromagnetic material.

15. A magnetic recording write head for magnetizing regions in a magnetic recording layer, the write head comprising:
a write pole;
a spin torque oscillator (STO) comprising a ferromagnetic polarizer layer, a free layer, and a nonmagnetic spacer layer between the ferromagnetic polarizer layer and the free layer, wherein the ferromagnetic polarizer layer is located between the write pole and the free layer; and
a multilayer between the write pole and the ferromagnetic polarizer layer, the multilayer comprising:
a buffer layer in contact with the write pole;
an intermediate oxide layer on and in contact with the buffer layer and comprising an oxide of one or more of Mg, Al, Ti and Ta; and
a metal or metal alloy seed layer for the ferromagnetic polarizer layer on and in contact with the intermediate oxide layer, wherein the ferromagnetic polarizer layer is on and in contact with the seed layer.

16. The head of claim 15, wherein the intermediate oxide layer consists of MgO.

17. The head of claim 15, wherein the seed layer comprises a film selected from a Ru film and a NiAl film.

18. The head of claim 15, wherein the buffer layer comprises one or more films selected from one or more of Cu, Cr, Ta, Ru, Hf and Nb and their alloys.

19. The head of claim 15, further comprising a trailing shield and a nonmagnetic capping layer between the free layer and the trailing shield.

20. The head of claim 15, further comprising an electrically conductive coil coupled to the write pole, the write pole adapted to generate a magnetic write field in the presence of electrical write current through the coil, and STO electrical circuitry between the write pole and the free layer for directing electron flow from the write pole to the free layer, whereby the free layer is adapted to provide microwave-assisted magnetic recording to the recording layer in the presence of current through the STO electrical circuitry.

* * * * *